United States Patent [19]
Kister

[11] Patent Number: 5,720,098
[45] Date of Patent: Feb. 24, 1998

[54] METHOD FOR MAKING A PROBE PRESERVING A UNIFORM STRESS DISTRIBUTION UNDER DEFLECTION

[75] Inventor: January Kister, Menlo Park, Calif.

[73] Assignee: Probe Technology, Santa Clara, Calif.

[21] Appl. No.: 440,521

[22] Filed: May 12, 1995

[51] Int. Cl.$^6$ .............................. H01R 43/16; G01R 1/02; G01R 3/00
[52] U.S. Cl. .......................... 29/825; 29/593; 29/874; 324/72.5; 324/761; 439/482
[58] Field of Search ..................... 29/815, 827, 874, 29/593, 883; 439/482; 324/72.5, 761, 754

[56] References Cited

U.S. PATENT DOCUMENTS

| | | | |
|---|---|---|---|
| 3,599,093 | 8/1971 | Oates | 439/482 X |
| 3,812,311 | 5/1974 | Kvatermik | 324/761 X |
| 4,618,821 | 10/1986 | Lenz | 324/72.5 X |
| 5,457,882 | 10/1995 | Clarke et al. | 29/825 X |

FOREIGN PATENT DOCUMENTS 3014127 11/1980 Germany ................ 439/482

*Primary Examiner*—Peter Vo
*Attorney, Agent, or Firm*—Lumen Intellectual Property Services

[57] ABSTRACT

The invention presents a method and a correspondingly designed probe for achieving uniform stress distribution when experiencing deflection. The probe has a top edge, a bottom edge, a tip, and a beam portion defined by selecting an inflection point along the top edge, such that the beam portion is contained between the tip and the inflection point, and the bottom edge below the beam portion is approximately straight, while the curvature of the top edge of the beam portion is fitted to a parabola. The tip has an outer edge, an inner edge, and a point of contact at the location where the outer and inner edges join. The inner edge is approximately straight while the curvature of the outer edge is fitted to a second parabola. The probe is preferably mounted in a support structure having a groove for receiving the probe such that the beam portion is free to move vertically in the groove and constrained laterally to prevent side-buckling.

6 Claims, 3 Drawing Sheets

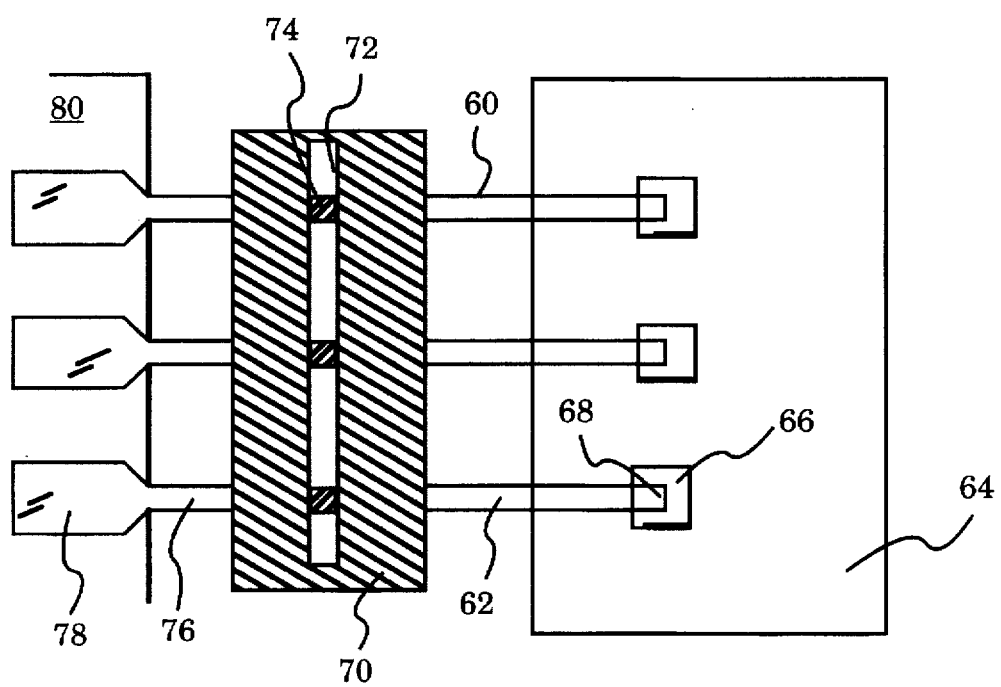
FIG. 6
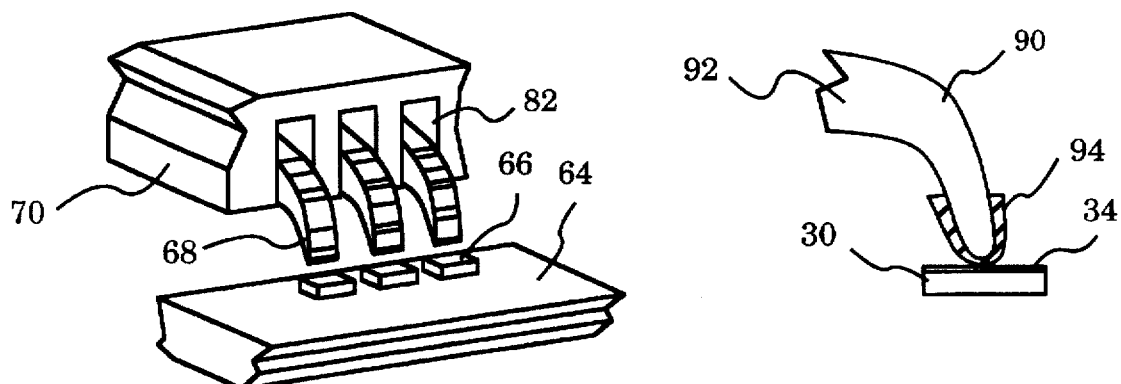
FIG. 7
FIG. 8

METHOD FOR MAKING A PROBE PRESERVING A UNIFORM STRESS DISTRIBUTION UNDER DEFLECTION

BACKGROUND

1. Field of the Invention

The present invention relates to the field of testing electrical circuitry using testing devices with contact probes, and in particular to the design of such probes for achieving uniform stress distribution under deflection.

2. Description of Prior Art

Probe cards or testing devices are crucial for efficient manufacture of electronic circuits. These devices enable one to test and isolate defective circuits during production. Probe cards are frequently employed for functional testing of integrated circuits on wafers before cutting and mounting them inside an IC chip package. The arbitrary positions and enormous number of contact pads in such circuits, especially in the very large scale integration domain, impose stringent requirements on probe cards.

In particular, the probe card's contacting elements, probe needles or probes are affected by these conditions. The probe is repetitively driven against the pads on wafers under test. The distance by which the probes are moved towards the pads is commonly called overdrive. When driven against the pad the probe undergoes a deflection and its tip executes a lateral movement. The lateral scrubbing of the tip helps to remove an insulating oxide layer formed on the surface of the pad. This ensures proper electrical contact between the probe and the pad. Otherwise, the contact resistance between the probe and the pad would prevent the passage of electrical signals necessary for testing.

Furthermore, the repetitive nature of the testing process, geometrical unevenness of wavers, abrasion and fatigue of probe tips all affect the long-term probe performance. In particular, these factors affect the horizontal alignment or planarity of the probe tips and prevents the establishment of proper electrical contact between the probes and the corresponding pads. Large variance in planarity can not be overcome by increasing the overdrive since this would damage or even destroy the probes. Thus, planarity should be preserved at all times.

Attempts have been made at solving these problems by suitable probe mounting and design. In U.S. Pat. No. 5,334,931 Clarke et al. present a probe formed from a molded plastic and equipped with a conductive contact tip. The body of the probe is cantilevered and designed such that the contact tip scrubs the surface of the pad of a device under test when overdrive is applied. Although this construction makes replacement of the conductive contact tip simple, the mounting arrangement is complicated, and planarity can not be ensured after many testing cycles.

In U.S. Pat. No. 5,280,236 Takahashi et al. propose a probe made of a cobalt-based alloy containing at least 10 wt. % of chromium. The probe has a solder-enhanced metallic layer on its other end. These provisions ensure good scrubbing action due to the metallic coating on the tip and probe longevity due to the elasticity of the probe itself. Nonetheless, the application of repetitive stress disturbs probe planarity and deforms the probes.

Finally, in U.S. Pat. No. 4,980,638 Dermon et al. present a probe of controlled shape and dimensions. The shaft portion of the probes is tapered for easy replacement of probes. The probes are etched out of a sheet. There are no provisions to ensure longevity of the probes or sufficient planarity. In fact, all of the above-mentioned prior art probes suffer from long-term stress fatigue. Consequently, planarity is lost and, in more severe cases, probes break under stress concentrating at their attachment or support points.

OBJECTS AND ADVANTAGES OF THE INVENTION

In view of the above, it is object of the present invention to provide a method for producing probes which maintain uniform stress during testing. In particular, the probe designed according to the invention maintains a uniform stress while the probe is deflected and its tip describes a scrubbing motion due to applied overdrive. Uniform stress distribution will prevent the loss of planarity, breaking of probes, and deformations due to fatigue. Furthermore, the design of the invention extends the life of the probes.

Yet another object of the invention is to provide a low-cost and simple method for making and mounting probes designed according to the invention.

These and other objects and advantages will become more apparent after consideration of the ensuing description and the accompanying drawings.

SUMMARY OF THE INVENTION

In accordance with the objects of the invention, the stress experienced by probes is alleviated through a suitable design of the probe. In particular, the invention presents a method for making a probe which preserves a uniform stress distribution when experiencing a deflection due to an overdrive applied to the probe. The probe has a top edge, a bottom edge, a tip, and a distal end opposite the tip. The overdrive causes the tip to contact a pad of a circuit under test with a test force F.

According to the method, a beam portion of the probe is defined by selecting an inflection point along the top edge, such that the beam portion is contained between the tip and the inflection point, and the bottom edge below the beam portion is approximately straight. The curvature of the top edge of the beam portion is fitted to a parabola, such that the test force F applied to the tip distributes itself uniformly in the probe and produces a deflection of the beam portion of the probe and a scrubbing motion of the tip.

Preferably a reference width W is defined between said inflection point and said bottom edge, and the reference width W is used to calculate the parabola in accordance with the following equation:

$$W(x) = \sqrt{x} \cdot \sqrt{\frac{6 \cdot F}{b \cdot \sigma}}$$

wherein b is the thickness of the probe, $\sigma$ is the stress, and x varies from 0 to the length L of the bee portion.

In a preferred embodiment the shape of the tip is also predetermined. In particular, the tip has an outer edge, an inner edge, and a point of contact at the location where the outer and inner edges join. From the end point of the top edge to the point of contact the tip length is equal to T. Along this tip length T the inner edge is approximately straight and the curvature of the outer edge is fitted to a second parabola calculated from a reference breadth M defined between the end point of the top edge and the inner edge. The equation for calculating this second parabola is analogous to the first one. In fact the breadth m(x) of the second parabola is computed as follows:

$$m(x) = \sqrt{x} \cdot \sqrt{\frac{6 \cdot F_1}{b \cdot \sigma}}$$

wherein b is the thickness of the probe, σ is the stress, and x varies from 0 to length T of the tip. When x=T the breadth m(x) of the second parabola equals to reference breadth M. $F_1$ is the component of the test force normal to the tip.

The probe is mounted in a support structure having a groove for receiving the probe such that the beam portion is free to move vertically in the groove and constrained laterally to prevent side-buckling. The support structure is preferably made of a ceramic. The probe is preferably mounted inside the groove by its distal portion either by bonding or soldering to the wall of the groove.

In a preferred embodiment the probe produced in accordance with the method of the invention has a locating tab positioned at the inflection point and the support structure has a slot aligned with the locating tab, such that the locating tab is positioned inside the slot. A better understanding and appreciation of the invention will be gained upon reading the detailed description referring to the attached figures.

BRIEF DESCRIPTION OF THE DRAWINGS

FIG. 6 is a top view of probes according to the invention mounted in a support structure.

FIG. 7 is a perspective view of probes arranged to perform a test.

FIG. 8 is a side view of a coated probe tip.

DESCRIPTION

Figure 1A:
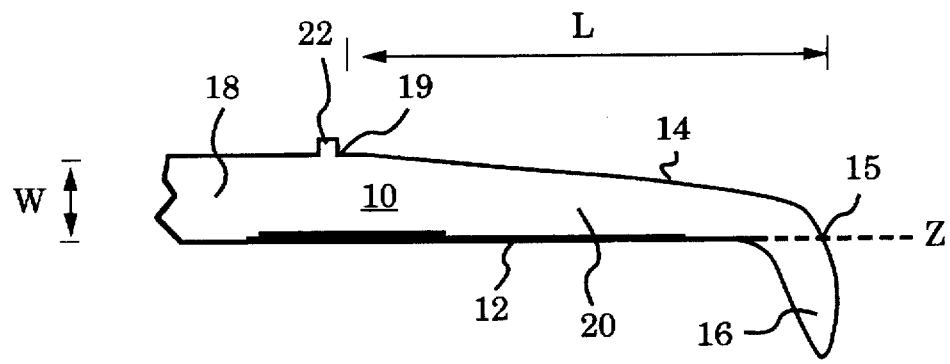
FIG. 1A is a side view of a probe according to the invention.

The most preferred embodiment of a probe 10 designed according to the method of the invention is shown in FIG. 1A. Here, probe 10 has a bottom edge 12, a top edge 14, a tip 16, and a distal end 18. Bottom edge 12 is approximately straight while top edge 14 is curved. In particular, the curvature of top edge 14 is fitted to a parabola between tip 16 and an inflection point 19. The end of top edge 14 and commencement of tip 16 is marked by an end point 15. End point 15 is collinear with bottom edge 12, as indicated by the extension of bottom edge 12 labelled with Z. The computations for determining the appropriate parabola are set forth below.

Probe 10 has a reference width, W, computed between inflection point 19 and bottom edge 12. Furthermore, the part of probe 10 between inflection point 19 and tip 16 defines a beam section 20 of length L.

In this embodiment the length, L, of beam section 20 is around 60 mil. Of course, L can range from 30 to 200 mil or beyond, however, a significantly longer or shorter beam section 20 is undesirable for mechanical reasons. The reference width, W, customarily ranges between 2 and 10 mil or more in order to produce sufficient deflection as discussed below.

Figure 1B:
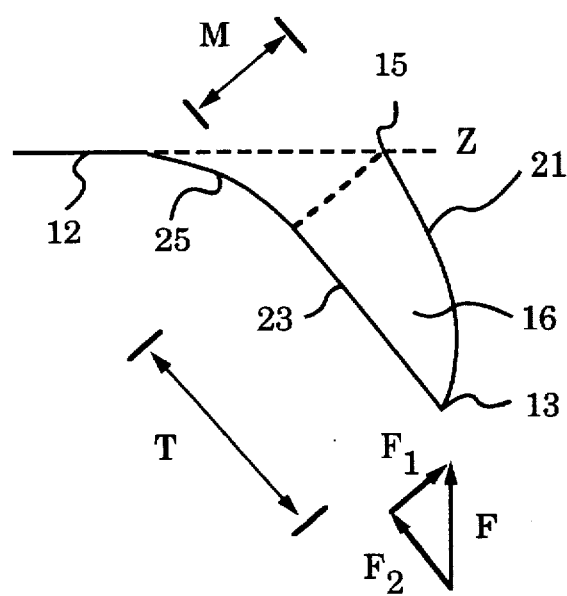
FIG. 1B is a detailed side view of the tip of the probe of FIG. 1A.

FIG. 1B shows the details of tip 16. Tip 16 has an outer edge 21 extending from end point 15 to a point of contact 13. An inner edge 23 of tip 16 continues from point of contact 13 to bottom edge 12 of beam section 20. In particulars, inner edge is straight opposite outer edge 21, and has a knee section 25 for joining smoothly to bottom edge 12. A reference breadth M is defined between end point 15 and inner edge 23, as shown. The distance between point of contact 13 and end point 15 defines a tip length T.

Figure 2:
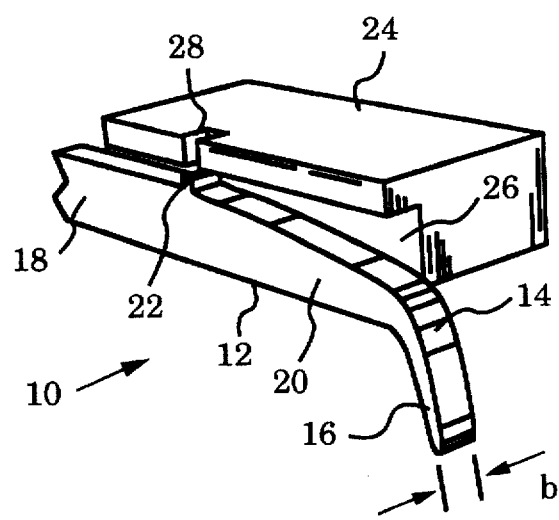
FIG. 2 is a sectional perspective view of a probe according to the invention located in a support structure.

Referring again to FIG. 1A, a locating tab 22 is positioned at inflection point 19. In this particular embodiment tab 22 is rectangular, though no particular shape is prescribed. FIG. 2 illustrates probe 10 being mounted in a groove 26 of a support structure 24. Structure 24 is preferably made of a ceramic material. In this case groove 26 can be easily machined by a laser, e.g., excimer laser.

Probe 10 has a width, b, preferably equal to about 1 mil. That is because typical pads which need to be contacted by point of contact 13 during testing can have a width of as little as 2.0 mil and a pitch of 2.9 mil. The width and depth of groove 26 are sufficient to accommodate probe 10. In this embodiment the width of groove 26 is 1.1 mil and its depth is 5 mils. Distal end 18 of probe 10 is fixed inside groove 26.

Support structure has a slot 28 for receiving tab 22. In this embodiment slot 28 is rectangular to accommodate tab 22 of same shape. Distal end 18 of probe 10 and tip 16 can be better aligned by using tab 22. In a preferred method of locating probe 10 in groove 26 a vacuum is applied through slot 28. Tab 22 is drawn into slot 28 and causes probe 10 to align itself properly inside groove 26. Additional disposing of x-y-z, θ arms for grabbing tip 16 or distal end 18 and moving them into proper position can also be used. A persons skilled in the art is conversant with these techniques and devices.

Probe 10 is bonded to the walls of groove 26 once properly aligned. This is preferably done by soldering or adhesive bonding of a part of distal end 18 to the wall of groove 26. Specific bonding techniques are well-known in the art. In bonded probe 10 beam section 20 can move freely up and down over a range of at least 3 mil. Also, beam section 20 is secured against side-buckling by the walls of groove 26. Meanwhile, distal end 18 is rigidly attached inside groove 26.

It is important that the parabola defining the curvature of top edge 14 of beam section 20 be carefully calculated. In particular, to ensure a uniform distribution of stress inside probe 10 the parabola is calculated in accordance with the following equation:

$$w(x) = \sqrt{x} \cdot \sqrt{\frac{6 \cdot F}{b \cdot \sigma}}$$

Here, b is the thickness of the probe, σ is the stress, X is the distance of beam section 20, and F is the test force experienced by tip 16. Thus, the parabola to which top edge 14 of beam section 20 is fitted commences at end point 15 where x=0 and ends at 19 where x=L; in other words, w(0)=0 and w(L)=W. Bottom edge 12 is approximately straight along the entire beam section 20.

In a preferred embodiment the shape of tip 16 is also predetermined by fitting its outer edge 21 to a second parabola calculated in the same manner as the parabola for beam section 20. In particular, the breadth m(x) of the second parabola, is computed as follows:

$$m(x) = \sqrt{x} \cdot \sqrt{\frac{6 \cdot F_1}{b \cdot \sigma}}$$

wherein b is the thickness of the probe, σ is the stress, and x varies from 0 to length T of tip 16. Thus, the second parabola to which outer edge 21 is fitted commences at point of contact 13 where x=0 and terminates at end point 15 where x=M; in other words, m(0)=0 and m(T)=M. $F_1$ is the component of test force F normal to tip 16, as illustrated in FIG. 1B.

Figure 3:
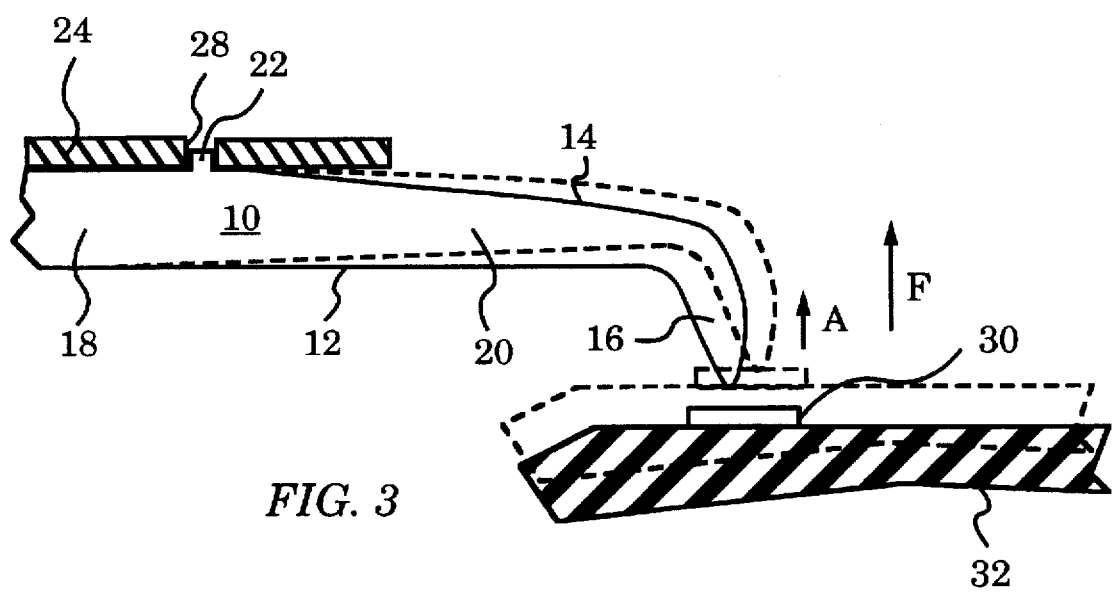
FIG. 3 is a side view of the probe of FIG. 2 undergoing deflection.
Figure 4:
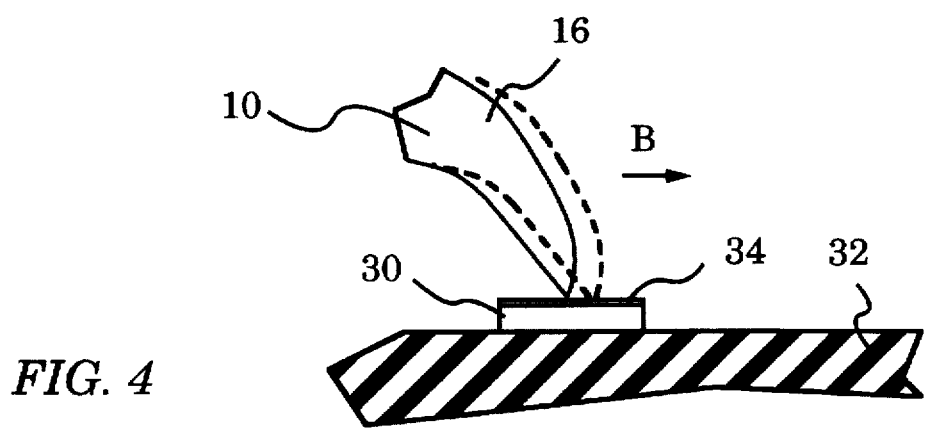
FIG. 4 is a side view of a tip of the probe of FIG. 3 describing a scrubbing motion.

The operation of probe 10 is clarified in FIGS. 3 and 4. In particular, FIG. 3 shows how probe 10 reacts to an overdrive urging tip 16 against a pad 30 on a test wafer 32. Initially, probe 10 hovers over pad 30 as indicated by the solid outline. An overdrive is applied in the direction of arrow A. This is done by either lowering structure 24 or raising wafer 32 according to well-known testing methods.

The overdrive distance typically ranges between 3 and 6 mil. At first, tip 16 approaches pad 30 and establishes contact with it. Further overdrive creates a test force F on tip 16 and causes beam section 20 to be deflected as illustrated by the dotted outline. In most situations the overdrive or distance traveled until contact between tip 16 and pad 30 is established equals to about 1.5 mil. A desirable deflection of beam section 20 is 3 mil in response to test force F=0.06 Newtons.

In addition to deflecting beam section 20, the $F_1$ component of force F (see FIG. 1B) will cause tip 16 to perform a scrubbing movement, as shown in FIG. 4. This movement will occur in the direction of arrow B and is typically very short, 1 mil or less. Nonetheless, scrubbing is very important in the testing process because it removes an oxide layer 34 and any impurities (not shown) accumulated on top of pad 32. A good electrical contact between tip 16 and pad 32 is thus guaranteed.

Probe 10 having a parabolic curvature of beam section 20 is very advantageous. It resists fatigue because of uniform stress distribution inside the beam section. Unlike conventional probes, it is not prone to breaking at the point of attachment, and is simple in construction. Furthermore, the life of the probe is extended as well.

Figure 5:
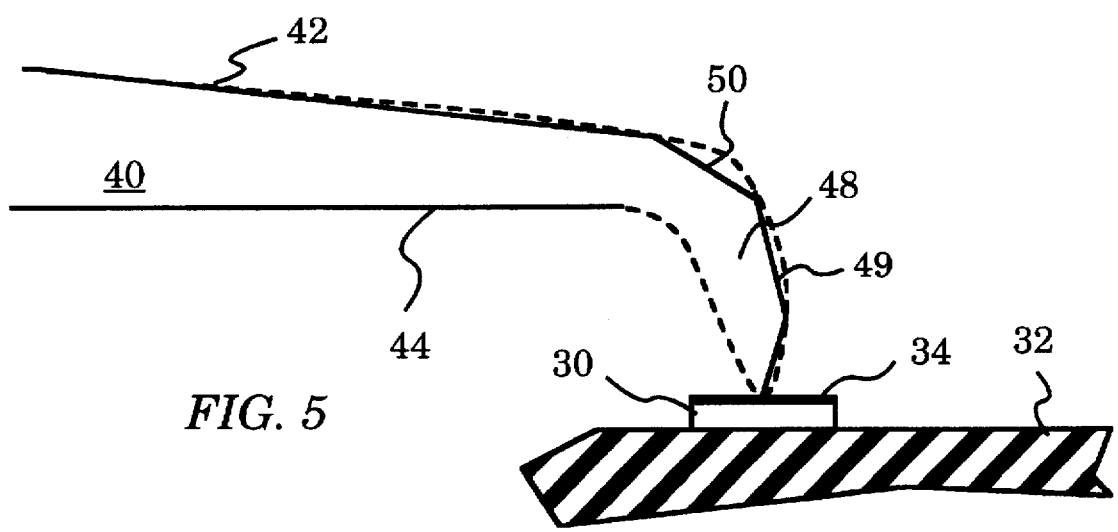
FIG. 5 is a side view of the beam portion of another probe according to the invention.

FIG. 5 shows another embodiment of a probe 40 according to the invention. Probe 40 has a top edge 42, a bottom edge 44, a beam portion 46, and a tip 48 with an outer edge 49. Tip 48 is shown resting on top of pad 30 of wafer 32. The essential difference between the preferred embodiment is that the parabolic curvature of top edge 42 and the parabolic curvature of outer edge 49 is approximated by straight sections 50. This is done for practical reasons, since shaping top edge 42 and outer edge 49 to conform to the first and second parabolas can be very difficult. Although each parabola is approximated by two straight sections 50 in the embodiment shown in FIG. 5, any number of such sections can be used. In fact, an entire parabola, e.g., the parabola of top edge 42, can be approximated by one straight section. Otherwise, the operation and advantages of this embodiment are the same as those disclosed for the preferred implementation above.

FIG. 6 illustrates a number of probes 60 with parabolic curvature of top edges 62. Probes 60 are mounted for carrying out an actual test. A test circuit 64 with pads 66 is positioned directly under tips 68. A support structure 70 with a long slot 72 for receiving tabs 74 preserves surmounts probes 60 to provide lateral stability and guide the probes. Distal ends 76 of probes 60 are attached to a probe card 80 by solder junctions 78.

FIG. 7 depicts the positions of tips 68 more clearly. In particular, grooves 82 are visible in this perspective view. Although all tips 68 appear in the same plane in FIG. 7, in practice deviations of 1.5 mil between the plane of the die and the plane of the probe tips are common. This lack of planarity is compensated by a longer overdrive. In particular, to ensure a 3 mil deflection of beam sections 62 the overdrive should be at least 4.5 mil. The first 1.5 mil will compensate for planarity deviations and the remaining 3 mil will produce the desired deflection and scrubbing.

Preferably, however, tips 68 are first sanded after mounting (as described above) to achieve a planarity of 0.3 mil. Because of the parabolic shape of top edges 62 probes 60 will maintain this planarity over a very large number of cycles.

Finally, FIG. 8 shows a specially treated tip 90 of a probe 92 according to the invention. A coating 94 encapsulates tip 90. The addition of such coating can take place after sanding of tip 90. Electroplating, sputtering, or any other suitable processes can be used to deposit coating 94. Conventional, wear-resistant coatings are preferred, e.g., the MP35N cobalt alloy or rhodium.

The presented probe design method and probes produced according to it should be viewed as exemplary of the invention. Many modifications to the method are possible. For example, the curvature of the parabolas can be approximated by other geometrical forms than straight sections. Additionally, the support structure with grooves can be left out in cases where side-buckling does not occur. This happens when the thickness of the probe b is sufficiently large to render the probe laterally rigid. In this instance the probe can be mounted on a support structure without grooves according to traditional techniques.

Therefore, the scope of the invention should be determined, not by examples given, but by the appended claims and their legal equivalents.

I claim:

1. A method for making a probe which preserves a uniform stress distribution when experiencing a deflection due to an overdrive applied to said probe, said method comprising the following steps:
   a) providing a blank of electrically conductive material;
   b) defining in said blank a probe having a top edge, a bottom edge, a tip and a distal end opposite said tip;
   c) forming a beam portion of length L in said blank between an end point of said top edge and an inflection point along said top edge, said beam portion having a varying width w(x) between said top edge and said bottom edge, where x=0 at said end point and x=L at said inflection point, said width w(x) being equal to a reference width W at said inflection point, said beam portion having a straight bottom edge;
   d) shaping the curvature of said top edge to fit a parabola by setting said width w(x) in accordance with the following equation:

$$w(x) = \sqrt{x} \cdot \sqrt{\frac{6 \cdot F}{b \cdot \sigma}}$$

wherein b is the thickness of said probe, σ is the stress, and x ranges from 0 to L, such that when said overdrive is applied and causes said tip to contact a pad of circuit under test with a test force F said test force F distributes itself uniformly in said probe and produces a deflection of said beam portion and a scrubbing motion of said tip, thereby forming said probe preserving the uniform stress distribution inside said tip.

2. The method of claim 1, wherein said tip is formed to have a tip length T, an outer edge, an inner edge, and a point of contact at the location where said outer edge and said inner edge join, said inner edge opposite said outer edge being approximately straight, said tip having a variable breadth m(x) between said outer edge and said inner edge, where x=0 at said point of contact and x=T at said end point, said breadth m(x) being equal to a reference breadth M at said end point.

3. The method of claim 2, wherein the curvature of said outer edge is shaped to fit to a second parabola by setting said breadth m(x) in accordance with the following equation:

$$m(x) = \sqrt{x} \cdot \sqrt{\frac{6 \cdot F_1}{b \cdot \sigma}}$$

where x ranges from 0 to T, and $F_1$ is the component of said test force F normal to said tip.

4. The method of claim 3, wherein said second parabola is approximately formed by a number of straight sections.

5. A method for making a probe which preserves a uniform stress distribution when experiencing a deflection due to an overdrive applied to said probe, said method comprising the following steps:

a) providing a blank of electrically conductive material;
b) defining in said blank a probe having a top edge, a bottom edge, a tip and a distal end opposite said tip;
c) forming a beam portion of length L in said blank between an end point of said top edge and an inflection point along said top edge, said beam portion having a varying width w(x) between said top edge and said bottom edge, where x=0 at said end point and x=L at said inflection point, said width w(x) being equal to a reference width W at said inflection point, said beam portion having a straight bottom edge;
d) forming said tip portion to have a tip length T, an outer edge, an inner edge and a point of contact at the location where said outer edge and said inner edge join, said inner edge opposite said outer edge being approximately straight, said tip having a variable breadth m(x) between said outer edge and said inner edge, where x=0 at said point of contact and x=T at said end point, said breadth m(x) being equal to a reference breadth M at said end point;
e) shaping the curvature of said outer edge to fit a parabola by setting said breadth m(x) in accordance with the following equation:

$$m(x) = \sqrt{x} \cdot \sqrt{\frac{6 \cdot F_1}{b \cdot \sigma}}$$

wherein b is the thickness of said probe, $\sigma$ is the stress, and x ranges from 0 to T and $F_1$ is the component of a test force F normal to said tip, such that when said overdrive is applied and causes said tip to contact a pad of a circuit under test with said test force F, $F_1$ distributes itself uniformly in said tip, thereby forming said probe preserving the uniform stress distribution inside said tip.

6. The method of claim 5, wherein said second parabola is approximately formed by a number of straight sections.

* * * * *